United States Patent
Bhushan

(10) Patent No.: US 7,685,495 B2
(45) Date of Patent: Mar. 23, 2010

(54) APPARATUS AND METHOD FOR CHANNEL INTERLEAVING IN COMMUNICATIONS SYSTEM

(75) Inventor: Naga Bhushan, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 807 days.

(21) Appl. No.: 11/305,579

(22) Filed: Dec. 16, 2005

(65) Prior Publication Data

US 2006/0259846 A1 Nov. 16, 2006

Related U.S. Application Data

(60) Provisional application No. 60/681,199, filed on May 13, 2005, provisional application No. 60/680,855, filed on May 12, 2005.

(51) Int. Cl.
*H03M 13/00* (2006.01)
(52) U.S. Cl. .......... 714/755; 714/786
(58) Field of Classification Search .......... 714/755, 714/786
See application file for complete search history.

(56) References Cited

U.S. PATENT DOCUMENTS

| 5,572,532 | A | 11/1996 | Fimoff et al. | |
|---|---|---|---|---|
| 6,304,581 | B1 | 10/2001 | Chen | |
| 6,707,806 | B1 * | 3/2004 | Kato | 370/336 |
| 6,744,744 | B1 * | 6/2004 | Tong et al. | 370/320 |
| 6,987,778 | B2 | 1/2006 | Sindhushayana et al. | |
| 7,379,416 | B2 * | 5/2008 | Yang et al. | 370/208 |
| 7,400,607 | B2 * | 7/2008 | Kim et al. | 370/335 |
| 2004/0257992 | A1 * | 12/2004 | Dottling et al. | 370/230 |
| 2005/0180363 | A1 * | 8/2005 | Yano et al. | 370/335 |
| 2006/0156199 | A1 * | 7/2006 | Palanki et al. | 714/776 |

FOREIGN PATENT DOCUMENTS

JP 2003309535 10/2003

(Continued)

OTHER PUBLICATIONS

International Search Report—PCT/US06/017993, International Search Authority—European Patent Office—Sep. 21, 2007.

(Continued)

*Primary Examiner*—Esaw T Abraham
(74) *Attorney, Agent, or Firm*—Kenneth Vu

(57) ABSTRACT

An apparatus and method for interleaving systematic bits and parity bits to generate an output sequence that can be transmitted in multi-slot packets from a base station to a remote station in a wireless communication system. The apparatus comprises a memory element and a control element coupled to the memory element, wherein the control element is configured to demultiplex the systematic bits and parity bits into sequences, wherein the systematic bits and parity bits are sequentially distributed among the sequences. The control element is further configured to reorder the sequences based on an index set, to group the sequences into segments and to interleave each of the segments forming matrices having elements. The control element is also configured to modulate the elements of the matrices, and to truncate the modulated elements of each matrix, so as to produce the output sequence which comprises truncated modulating elements from each matrix of the matrices.

55 Claims, 6 Drawing Sheets

FOREIGN PATENT DOCUMENTS

| RU | 2233541 | 7/2004 |
|---|---|---|
| WO | 2004015948 | 2/2004 |
| WO | 06117651 | 11/2006 |

OTHER PUBLICATIONS

Written Opinion—PCT/US06/017993, International Search Authority—European Patent Office—Sep.21, 2007.

International Preliminary Report on Patentability—PCT/US06/017993, The International Bureau of WIPO—Geneva, Switzerland, Nov. 13, 2007.

Agashe, et el., "cdma2000® High Rate Broadcast Packet Data Air interface Design," IEEE Communications Magazine, vol. 42, No. 2. Feb. 2004, pp. 83-89, XP002534479.

Bender, et al., "CDMA/HDR: A Bandwidth-Efficient High-Speed Wireless Data Service for Nomadic Users," IEEE Communications Magazine, vol. 38, No. 7. Jul. 1, 2000, pp. 70-77, XP010091318.

Wu, at al., "The cdma2000 High Rate Packet Data System," 80-H0593-1, Rev. A, Mar. 26, 2002, XP002303829.

Sindhushayana, et al., "Forward link coding and modulation for CDMA2000 1XEV-DO (IS-856)" 13th IEEE International Symposium on Personal, Indoor, and Mobile Radio Communications, 2002, vol. 4. Sep. 15-18, 2002, USA, pp. 1839-1846, XP010611584.

"cdma2000 High Rate Packet Data Air Interface Specification" 3rd Generation Partnership Project (3GPP): Technical Specification Group (TSG) Radio Access Network (RAN); Working Group 2 (WG2), Mar. 1, 2004, pp, 13-63-13-70, XP003003214.

Supplementary European Search Report - EP06752461, Search Authority - Munich Patent Office, Jun. 29, 2009.

\* cited by examiner

APPARATUS AND METHOD FOR CHANNEL INTERLEAVING IN COMMUNICATIONS SYSTEM

CLAIM OF PRIORITY UNDER 35 U.S.C. §119

The present Application for Patent claims priority to Provisional Application No. 60/681,199, entitled "Enhanced Channel Interleaver for Platinum Broadcast," filed May 13, 2005, and to Provisional Application No. 60/680,855, entitled "Enhanced Channel Interleaver for Platinum Broadcast," filed May 12, 2005, both of which are expressly incorporated herein by reference.

BACKGROUND

1. Field

This invention generally relates to wireless communications and, more specifically, to channel interleaving for communication systems providing broadcast/multicast services.

2. Background

The field of wireless communications has many applications including, e.g., cordless telephones, paging, wireless local loops, personal digital assistants (PDAs), Internet telephony, and satellite communication systems. A particularly important application is cellular telephone systems for mobile subscribers. As used herein, the term "cellular" system encompasses both cellular and personal communications services (PCS) frequencies. Various over-the-air interfaces have been developed for such cellular telephone systems including, e.g., Frequency Division Multiple Access (FDMA), Orthogonal Frequency Division Multiplexing (OFDM) modulation, Time Division Multiple Access (TDMA), and Code Division Multiple Access (CDMA). In connection therewith, various domestic and international standards have been established including, e.g., Advanced Mobile Phone Service (AMPS), Global System for Mobile (GSM), and Interim Standard 95 (IS-95). In particular, IS-95 and its derivatives, IS-95A, IS-95B, ANSI J-STD-008 (often referred to collectively herein as IS-95), and proposed high data rate systems for data, etc., are promulgated by the Telecommunication Industry Association (TIA), the International Telecommunications Union (ITU), and other well known standards bodies.

Cellular telephone systems configured in accordance with the use of the IS-95 standard employ CDMA signal processing techniques to provide highly efficient and robust cellular telephone service. Exemplary cellular telephone systems configured substantially in accordance with the use of the IS-95 standard are described in U.S. Pat. Nos. 5,103,459 and 4,901,307. An exemplary system utilizing CDMA techniques is the cdma2000. The standard for cdma2000 is given in Standard IS-2000, which is compatible with IS-95 systems in many ways. Another CDMA standard is the WCDMA standard, as embodied in $3^{rd}$ Generation Partnership, Project "3GPP", Document Nos. 3G TS 25.211, 3G TS 25.212, 3G TS 25.213, and 3G TS 25.214. Another CDMA standard is Standard IS-856, which is commonly referred to as a High Data Rate (HDR) system.

Transmission of digital data is inherently prone to interference, which may introduce errors into the transmitted data. To improve the performance of a transmission channel, some coding schemes include interleavers, which mix up the order of the bits in the packet during coding. Thus, when interference destroys some adjacent bits during transmission, the effect of the interference is spread out over the entire original packet and can more readily be overcome by the decoding process. Recently, broadcast/multicast services have been proposed to effectively transmit large quantities of data from a single source point to a group of users in wireless communication systems. Contents suitable for such point-to-multipoint services include news, stock quotes, sports events, movies, audio and video clips, and other multimedia data. As the demand for transmission of multimedia data grows, there lies a challenge to enhance such services and a need for enhanced channel interleaving supporting broadcast/multicast services.

SUMMARY

Novel and improved methods and apparatuses for interleaving a plurality of systematic bits and a plurality of parity bits to generate an output sequence that can be transmitted in multi-slot packets from a base station to a remote station in a wireless communication system are presented herein.

In one aspect, the apparatus comprises means for demultiplexing the plurality of systematic bits and parity bits into a plurality of sequences, wherein the plurality of systematic bits and parity bits are sequentially distributed among the sequences; means for reordering the sequences based on an index set; means for grouping the sequences into a plurality of segments and for interleaving each of the segments forming a plurality of matrices having a plurality of elements; means for modulating the elements of the matrices; and means for truncating the modulated elements of each matrix, wherein the output sequence comprises truncated modulating elements from each matrix of the plurality of matrices. With this aspect, the demultiplexing occurs by storing the systematic bits and the parity bits into a plurality of rectangular arrays of R rows and C columns forming a first input block U, a second input block $W_0$, and a third input block $W_1$, wherein the first input block U comprises the systematic bits, the second input block $W_0$ is formed by concatenating a first set of the parity bits, and the third input block $W_1$ is formed by concatenating a second set of the parity bits. The systematic bits and the parity bits are written into the arrays of the input blocks U, $W_0$, and $W_1$ by rows, and the bits are placed starting from the top row and are placed from left to right. With this aspect, the index set may be sorted in an ascending order. The reordering may occur by defining the index set as having a plurality of sets; sorting a plurality of elements of each of the sets; and reordering the plurality of sequences in accordance with the rate sets. The interleaving may occur by grouping the reordered sequences into segments; and performing matrix interleaving on each of the segments. The modulation scheme for the modulating means may be 16-QAM. The truncating means may further comprise means for repeating the modulating elements. In another aspect, the parameters for the index set may be stored in a look-up table.

In another aspect, there is disclosed a method for interleaving a plurality of systematic bits and a plurality of parity bits and for generating an output sequence that can be transmitted in multi-slot packets from a base station to a remote station in a wireless communication system. The method comprises demultiplexing the plurality of systematic bits and parity bits into a plurality of sequences, wherein the systematic bits and parity bits are sequentially distributed among the sequences; reordering the sequences based on an index set; grouping the sequences into a plurality of segments and interleaving each of the segments forming a plurality of matrices having a plurality of elements; modulating the elements of the matrices; and truncating the modulated elements of each matrix, wherein the output sequence comprises truncated modulating elements from each matrix of the plurality of matrices. With this aspect, the truncating may be performed in accordance with a desired code symbol rate. It is appreciated that the modulating and truncating may be interchanged without affecting the output sequence of the invention.

In yet another aspect, an apparatus for interleaving a plurality of systematic bits and a plurality of parity bits and to generate an output sequence that can be transmitted in multi-slot packets from a base station to a remote station in a wireless communication system is presented. This apparatus comprises means for demultiplexing the plurality of systematic bits and parity bits into a plurality of sequences, wherein the plurality of systematic bits and parity bits are sequentially distributed among the sequences; means for reordering the sequences; means for forming a plurality of matrices from the reordered sequences, wherein the forming means is based on an index set; means for permuting the matrices forming a juxtaposed matrix having a plurality of segments, a plurality of columns, and a plurality of elements; means for interleaving the columns; means for modulating the elements in the segments; and means for truncating the modulated elements in the segments of the juxtaposed matrix, wherein the output sequence comprises truncated modulating elements from the segments of the juxtaposed matrix.

With the above aspect, the demultiplexing occurs by storing the systematic bits and the parity bits into a plurality of rectangular arrays of R rows and C columns forming a first input block U, a second input block $W_0$, and a third input block $W_1$, wherein the first input block U comprises of the systematic bits, the second input block $W_0$ is formed by concatenating a first set of the parity bits, and the third input block $W_1$, is formed by concatenating a second set of the parity bits. The systematic bits and the parity bits are written into the arrays of the input blocks U, $W_0$, and $W_1$ by rows, and the bits are placed starting from the top row and are placed from left to right. The index set may be sorted in an ascending order. The reordering may occur by end-around shifting downward each element in each column of each block; and switching the order of the columns within each block. More specifically, within the first input block U, the symbols in the i-th column may be cyclically shifted by an amount (i mod R); and within the input blocks $W_0$ and $W_1$, the symbols in the i-th column may be cyclically shifted by an amount (floor(i/D)mod R), where D is a predetermined parameter based on a rate set and R denotes the number of rows of the rectangular arrays forming the input blocks. The forming may occur by defining the index set as having a plurality of sets having parameters that can be specified in a look-up table. The permuting may occur by arranging the columns of the matrices in a predetermined way and dividing the juxtaposed matrix into a plurality of segments having a predetermined number of columns. The interleaving may occur by shifting the i-th column to the $\pi$(i)-th column in each of the k-th segments, where $\pi$(i) =79imod$L_k$, $0 \le i < L_k$, and reading symbols in each of the segments with row index incrementing first, followed by column index. The modulation scheme for the modulating means may be 16-QAM. In addition, the truncating means may further comprise means for repeating the modulating elements. It is further appreciated that the parameters for the index set may be stored in a look-up table.

Another method for interleaving a plurality of systematic bits and a plurality of parity bits and to generate an output sequence that can be transmitted in multi-slot packets from a base station to a remote station in a wireless communication system is hereby presented, the method comprising demultiplexing the plurality of systematic bits and parity bits into a plurality of sequences, wherein the plurality of systematic bits and parity bits are sequentially distributed among the plurality of sequences; reordering the sequences; forming a plurality of matrices from the reordered sequences, wherein the forming is done based on an index set; permuting the matrices forming a juxtaposed matrix having a plurality of segments, a plurality of columns, and a plurality of elements; interleaving the columns; modulating the elements in the plurality of segments; and truncating the modulated elements in the segments of the juxtaposed matrix, wherein the output sequence comprises truncated modulating elements from the segments of the juxtaposed matrix. With this aspect, the truncating may be performed in accordance with a desired code symbol rate. It is appreciated that the modulating and truncating may be interchanged without affecting the output sequence of the invention.

These and other features of the invention will become more apparent with a discussion of the various embodiments in reference to the associated drawings.

BRIEF DESCRIPTION OF THE DRAWINGS

The accompanying drawings, which are included in and constitute a part of this specification, illustrate the embodiments of the invention and, together with the description, explain the features and principles of the invention. In the drawings.

DETAILED DESCRIPTION

Figure 1:
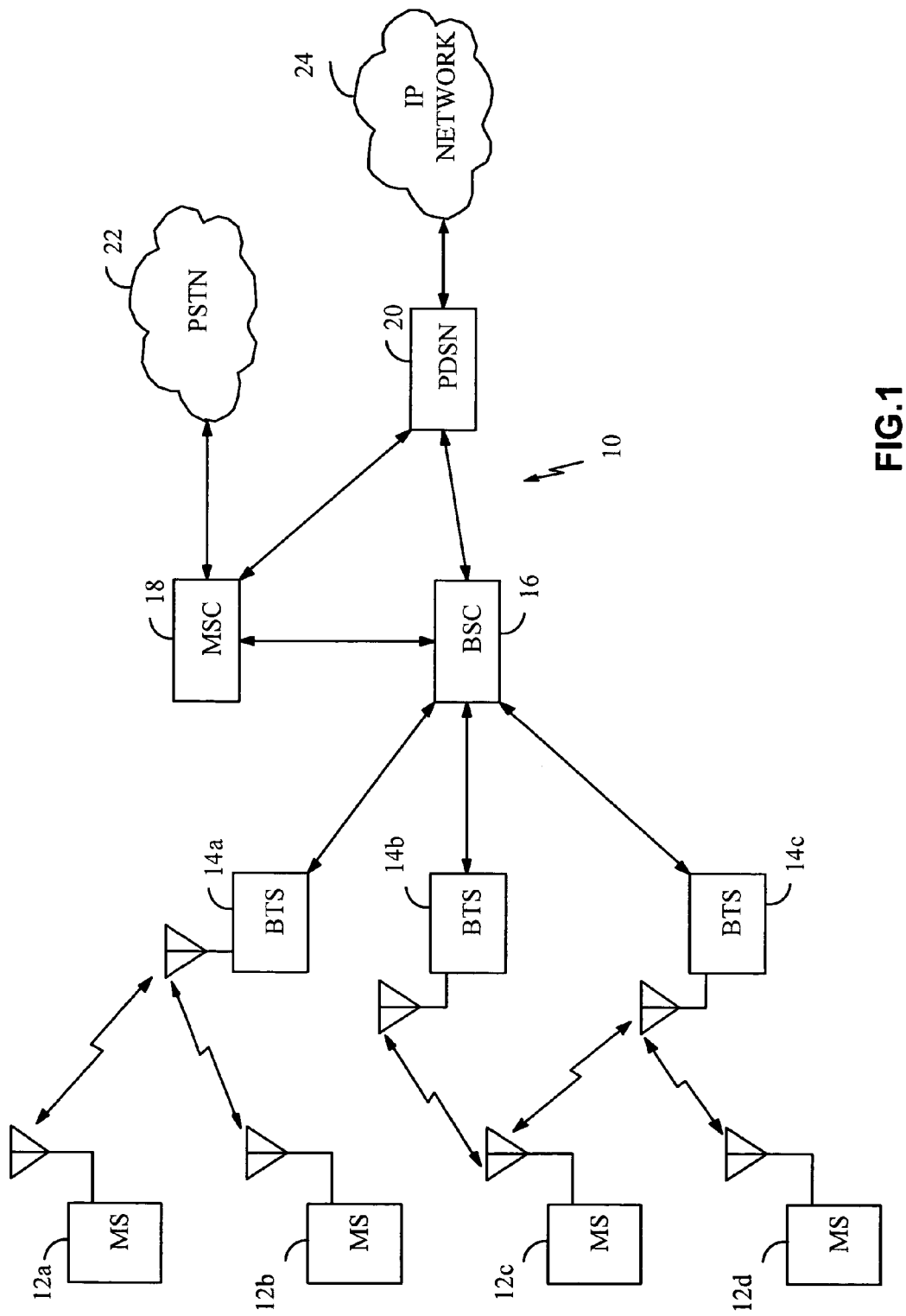
FIG. 1 is a block diagram of an exemplary voice and data communication system.

Referring to FIG. 1, there is shown a wireless communication network 10 which includes a plurality of mobile stations (also called subscriber units or user equipment) 12a-12d, a plurality of base stations (also called base station transceivers (BTSs) or Node B) 14a-14c, a base station controller (BSC) (also called radio network controller or packet control function) 16, a mobile switching center (MSC) or switch 18, a packet data serving node (PDSN) 20 (or internetworking function (IWF)), a public switched telephone network (PSTN) 22 (typically a telephone company), and an Internet Protocol (IP) network 24 (typically the Internet). For purposes of simplicity, four mobile stations 12a-12d, three base stations 14a-14c, one BSC 16, one MSC 18, and one PDSN 20 are shown. It is appreciated by those skilled in the art that there could be any number of mobile stations 12, base stations 14, BSCs 16, MSCs 18, and PDSNs 20.

In one aspect, the wireless communication network 10 is a packet data services network. The mobile stations 12a-12d may be any of a number of different types of wireless communication devices such as a portable phone, a cellular telephone that is connected to a laptop computer running IP-based, Web-browser applications, a cellular telephone with associated hands-free car kits, a personal data assistant (PDA) running IP-based, Web-browser applications, a wireless communication module incorporated into a portable computer, or a fixed location communication module such as might be found in a wireless local loop or meter reading system. In the most general embodiment, the mobile stations may be any type of communication unit.

The mobile stations 12a-12d may be configured to perform one or more wireless packet data protocols such as described in, for example, the EIA/TIAIIS-707 standard. In a particular aspect, the mobile stations 12a-12d generate IP packets destined for the IP network 24 and encapsulate the IP packets into frames using a point-to-point protocol (PPP).

With the above aspect, the IP network 24 is coupled to the PDSN 20, the PDSN 20 is coupled to the MSC 18, the MSC 18 is coupled to the BSC 16 and the PSTN 22, and the BSC 16 is coupled to the base stations 14a-14c via wirelines configured for transmission of voice and/or data packets in accordance with any of several known protocols including but not limited to, e.g., E1, T1, Asynchronous Transfer Mode (ATM), IP, Frame Relay, HDSL, ADSL, or xDSL. In an alternate aspect, the BSC 16 is coupled directly to the PDSN 20, and the MSC 18 is not coupled to the PDSN 20. In another aspect, the mobile stations 12a-12d communicate with the base stations 14a-14c over an RF interface as defined in the $3^{rd}$ Generation Partnership Project 2 "3GPP2," "Physical Layer Standard for cdma2000 Spread Spectrum Systems," 3GPP2 Document No. C.S0002-A, TIA PN-4694, published as TIA/EIA/IS-2000-2-A.

During typical operation of the wireless communication network 10, the base stations 14a-14c receive and demodulate sets of reverse-link signals from various mobile stations 12a-12d engaged in telephone calls, Web browsing, or other data communications. Each reverse-link signal received by a given base station 14a-14c is processed within that base station 14a-14c. Each base station 14a-14c may communicate with a plurality of mobile stations 12a-12d by modulating and transmitting sets of forward-link signals to the mobile stations 12a-12d. For example, as shown in FIG. 1, the base station 14a communicates with first and second mobile stations 12a, 12b simultaneously, and the base station 14c communicates with third and fourth mobile stations 12c, 12d simultaneously. The resulting packets are forwarded to the BSC 16, which provides call resource allocation and mobility management functionality including the orchestration of soft handoffs of a call for a particular mobile station 12a-12d from one base station 14a-14c to another base station 14a-14c. For example, a mobile station 12c is communicating with two base stations 14b, 14c simultaneously. Eventually, when the mobile station 12c moves far enough away from one of the base stations 14c, the call will be handed off to the other base station 14b.

If the transmission is a conventional telephone call, the BSC 16 will route the received data to the MSC 18, which provides additional routing services for interface with the PSTN 22. If the transmission is a packet-based transmission such as a data call destined for the IP network 24, the MSC 18 will route the data packets to the PDSN 20, which will send the packets to the IP network 24. Alternatively, the BSC 16 will route the packets directly to the PDSN 20, which sends the packets to the IP network 24.

In some exemplary CDMA systems, packets carrying data traffic are divided into subpackets, which occupy "slots" of a transmission channel. For illustrative ease only, the nomenclature of a High Data Rate (HDR) system is used herein and, more specifically, an HDR system providing broadcast/multicast services. It should be appreciated, however, that implementation of the invention is not limited to HDR systems. That is, embodiments of the invention may be implemented in other CDMA systems, such as, e.g., cdma2000, without affecting the scope of the embodiments described herein.

In an HDR system, slot sizes have been designated as 1.66 ms, but it should be understood that slot sizes may vary in the embodiments described herein without affecting the scope of the embodiments. For example, the slot size in cdma2000 systems is 1.25 ms in duration. In addition, data traffic may be transmitted in message frames, which may be 5 ms, 10 ms, 20 ms, 40 ms or 80 ms in duration in IS-95 systems. The terms "slots" and "frames" are terms used with respect to different data channels within the same or between different CDMA systems. A CDMA system comprises a multitude of channels on the forward and reverse links, wherein some channels are structured differently from others. Hence, the terminology to describe some channels will differ in accordance with channel structure. For illustrative purposes only, the term "slots" will be used hereafter to describe the packaging of signals propagated over the air.

Redundant representations of the data payload are packed into frames, or subpackets, which can then be soft-combined at the receiver. Redundancy refers to the substantially similar information carried by each subpacket. Redundant representations may be generated either through repetition or through additional coding. The process of soft-combining allows the recovery of corrupted bits. Through the process of soft combining, wherein one corrupted subpacket is combined with another corrupted subpacket, the transmission of repetitious and redundant subpackets can allow a system to transmit data at a minimum transmission rate. The transmission of repetitious and redundant subpackets is especially desirable in the presence of fading. Rayleigh fading, which is a form of multipath interference, occurs when multiple copies of the same signal arrive at the receiver at different phases, potentially causing destructive interference. Substantial multipath interference with very small delay spread can occur to produce flat fading over the entire signal bandwidth. If the remote station is traveling in a rapidly changing environment, deep fades could occur at times when subpackets are scheduled for retransmission. When such a circumstance occurs, the base station requires additional transmission power to transmit the subpacket.

For example, if a scheduler unit within a base station receives a data packet for transmission to a remote station, the data payload is redundantly packed into a plurality of subpackets, which are sequentially transmitted to a remote station. When transmitting the subpackets, the scheduler unit may decide to transmit the subpackets either periodically or in a channel sensitive manner.

The forward link from the base station to a remote station operating within the range of the base station can comprise a plurality of channels. Some of the channels of the forward link may include, but are not limited to a pilot channel, synchronization channel, paging channel, quick paging channel, broadcast channel, power control channel, assignment channel, control channel, dedicated control channel, medium access control (MAC) channel, fundamental channel, supplemental channel, supplemental code channel, and packet data channel. The reverse link from a remote station to a base station also comprises a plurality of channels. Each channel carries different types of information to the target destination. Typically, voice traffic is carried on fundamental channels, and data traffic is carried on supplemental channels or packet data channels. Supplemental channels are usually dedicated channels, while packet data channels usually carry signals that are designated for different parties in a time-multiplexed manner. Alternatively, packet data channels are also described as shared supplemental channels. For the purposes of describing the embodiments herein, the supplemental channels and the packet data channels are generically referred to as data traffic channels.

Supplemental channels and packet data channels can improve the average transmission rate of the system by allowing the transmission of unexpected data messages to a target station. Since the data payload can be redundantly packed on these channels, a multi-slot transmission scheduled on the forward link can be terminated early if the remote station can determine that the data payload is recoverable from the subpackets that have already been received. As described above, the data payload that is carried in each slot has undergone various encoding steps wherein the encoded bits are re-ordered into a channel-tolerant format. Hence, in order to accomplish data recovery, the decoder of the remote station must operate on the entire contents of each slot of the multi-slot transmission.

The embodiments described herein allow a minimum transmission rate to be maintained.

Determining Data Transmission Rates on the Forward Link

In an HDR system providing broadcast/multicast services, the rates at which the subpackets are to be transmitted from a base station to a remote station are determined by a rate control algorithm performed by the remote station and a scheduling algorithm at the base station. This method to modify the data transmission rate is referred to as an ARQ procedure. It should be noted that the system throughput is determined by the rate at which data payload is actually received, which differs from the bit rate of the transmitted subpackets.

The rate control algorithm is implemented by the remote station in order to determine which base station in the active set can provide the best throughput and to determine the maximum data rate at which the remote station can receive packets with sufficient reliability. The active set is the set of base stations that are currently in communication with the remote station. In a typical CDMA or non-CDMA wireless system, a base station transmits a known signal, referred to as a "pilot," at well-defined, periodic intervals. The remote station typically monitors the pilot signal of each base station maintained in the active set, and determines the signal-to-noise and interference ratio (SINR) of each pilot signal. Based on past SINR information, the remote station predicts a future value of the SINR for each base station, wherein the future value of the SINR will be associated with the next packet duration. The remote station then picks the base station that is likely to have the most favorable SINR over a period of the near future, and estimates the best data rate at which the remote station can receive the next data packet from this base station. The remote station then transmits a data rate control message (DRC) carrying this data rate information to the base station. It is understood that the best data rate information carried by the DRC is the data rate at which the remote station requests the next data packet to be transmitted. In an HDR system, the DRC messages are transmitted on a MAC channel of the reverse link waveform.

The scheduling algorithm is implemented at the base station to determine which remote station will be the recipient of the next packet. The scheduling algorithm takes into account the need to maximize base station throughput, the need to maintain fairness between all remote stations operating within the range of the base station, and the need to accommodate the data transmission rates requested by various remote stations. As discussed below, the fast ARQ procedure determines the actual data transmission rate at which each data packet is received, as opposed to the data transmission rate initially determined by the rate control algorithm.

A scheduling unit in the base station monitors the arrival of DRCs from all remote stations that are operating within its range, and uses the DRC information in the scheduling algorithm to determine which remote station will be the next data packet recipient, in accordance with an optimal forward link throughput level. It should be noted that an optimal forward link throughput takes into consideration the maintenance of acceptable link performances for all remote stations operating within the range of the base station. The scheduling unit reassembles the data packet into subpackets with the appropriate bit rate, and generates a transmission schedule for the subpackets on designated slots.

In an HDR system providing broadcast/multicast services, the forward link data rates vary from 409.6 kbps to 2.4 Mbps. The duration of each packet transmission in number of slots as well as other modulation parameters are shown in Table 1.

TABLE 1

OFDM FORMATS AND RATE SETS

| 320-tone Format | | | | | | 360-tone Format | | | |
|---|---|---|---|---|---|---|---|---|---|
| Rate Set 1 3072 payload | | Rate Set 2 2048 payload | | Rate Set 3 5120 payload | | Rate Set 4 4096 payload | | Rate Set 5 3072 payload | |
| Data Rate | # slots | Data Rate | # slots | Data Rate | # slots | Data Rata | # slots | Data Rate | # slots |
| 1.8M | 1 | 1.2M | 1 | 1.5M | 2 | 2.4M | 1 | 1.8M | 1 |
| 921.6k | 2 | 614.4k | 2 | 1.0M | 3 | 1.2M | 2 | 921.6k | 2 |
| 614.4k | 3 | 409.6k | 3 | 768k | 4 | 819 kpbs | 3 | 614.4k | 3 |

In an HDR system, code symbols that are transmitted in subpackets at lower data rates are code-extensions or repetitions of the code symbols that are transmitted at certain higher rates. In many cases, the code symbols transmitted in a given subpacket are shifted repetitions of the code symbols transmitted in the earlier slots of the packet. The lower data rates require a lower SINR for a given low probability of packet error. Hence, if the remote station determines that channel conditions are not favorable, then the remote station will transmit a DRC message requesting a low data rate packet, which comprises multiple subpackets. The base station will then transmit multi-slot packets in accordance with parameters stored in the scheduling unit.

As the subpackets are transmitted, the remote station may determine that the data packet can be decoded from only a portion of the subpackets scheduled for transmission. Using the fast ARQ procedure, the remote station instructs the base station to stop the transmission of the remaining subpackets, thereby increasing the effective data transmission rate of the system.

It should be noted that the ARQ procedure has the potential to significantly increase the forward link throughput of the underlying wireless communication system. As discussed above, when the remote station transmits a DRC message to the base station, the requested data transmission rate is determined using the rate control algorithm, which uses past SINR values to predict the SINR value of the near future. However, due to fading conditions that arise due to environmental factors and the mobility of the remote station, the prediction of the SINR for the near future is not reliable. In addition, the SINR of the forward link traffic signal may be very different from the SINR of the pilot signal due to interference from adjacent base stations. It is possible that some of the neighboring base stations may have been idle during the sampling period for the SINR prediction calculations. As a result, the remote station may not always predict the SINR with great accuracy. Therefore, the rate control algorithm provides a lower bound estimate for the actual SINR during the next packet duration with high probability, and determines the maximum data transmission rate that can be sustained if the actual SINR is equal to this lower bound estimate. In other words, the rate control algorithm provides a conservative measure of the data transmission rate at which the next packet can be received. The ARQ procedure refines this estimate, based on the quality of the data received during the initial stages of the packet transmission. Hence, it is important for the remote station to inform the base station as soon as the remote station has enough information to decode a data packet, so that early termination of transmissions can occur, which enhances the data transmission rate of the data packet.

Transmissions of the subpackets to the remote station are typically sent in a staggered pattern so that transmission gaps occur between the subpackets. In one aspect, the subpackets are transmitted periodically at every $4^{th}$ slot. The delay between subpackets provides an opportunity for the target remote station to decode the subpacket before the arrival of the next subpacket. If the remote station is able to decode the subpacket before the arrival of the next subpacket and to verify the Cyclic Redundancy Check (CRC) bits of the decoded result before the arrival of the next subpacket, the remote station can transmit an acknowledgment signal, hereinafter referred to as a FAST_ACK signal, to the base station. If the base station can demodulate and interpret the FAST_ACK signal sufficiently in advance of the next scheduled subpacket transmission, the base station need not send the remaining scheduled subpacket transmissions. The base station may then transmit a new data packet to the same remote station or to another remote station during the slot period that had been designated for the cancelled subpackets. It should be noted that the FAST_ACK signal herein described is separate and distinct from the ACK messages that are exchanged between the higher layer protocols, such as the Radio Link Protocol (RLP) and the Transmission Control Protocol (TCP).

Since the ARQ procedure allows a fast rate adaptation to channel conditions, the ARQ procedure allows for the implementation of a system wherein the initial data transmission can be performed at a high data rate and ramped down as needed. In contrast, a system without ARQ would be forced to operate at a lower data rate, in order to provide a sufficient link budget margin to account for channel variations during packet transmissions.

Transmitting Interleaved Symbols that Maximize Decoder Performance

In one aspect to reduce decoder operations, the subpackets can be transmitted in a manner that allows the decoder to determine the payload of the partial slot transmissions quickly, while still providing protection from burst errors.

A channel interleaver may be configured in accordance with this aspect to permute the bits of an encoded symbol and provide incremental redundancy. With this aspect, a permutation of the bits is designed so that the systematic bits are sent during a partial transmission of the multi-slot packet. The decoder may be able to determine the data payload from the arrival of only a portion of the subpackets. If the payload cannot be decoded, then the remote station transmits a negative acknowledgment on the ARQ channel. The base station receives the NAK and transmits a subsequent subpacket, containing additional parity bits. If the remote station cannot decode the subpackets with the already received systematic bits and the newly received parity bits, then another NAK is transmitted. The base station receives the second NAK and transmits another subpacket, which includes additional parity bits. As further NAKs are received during the ARQ procedure, subsequent subpackets transmitted by the base station contain more parity bits.

In other words, the channel interleaver permutes the systematic bits and the parity bits in a manner such that the systematic bits are loaded at the front of a packet and the parity bits are loaded at the rear of the packet. For transmission purposes, the packet is divided up into portions, and each portion is transmitted sequentially, as needed by the remote station. Hence, if additional information is needed to decode the data payload, only the additional parity bits are transmitted, rather than retransmitting the entire encoder output.

This process of loading systematic bits at the beginning of the scheduled packet transmission may appear to defeat the purpose of a channel interleaver, but the embodiments described herein can be implemented to provide resilience to burst errors while still allowing the decoder to operate on only a partial transmission of the packet. In many implementations of power-efficient, wireless communication systems using turbo codes, the output of the turbo encoder is scrambled either before or after channel interleaving so that data is randomized prior to modulation. The random scrambling of the turbo encoder output limits the peak-to-average ratio of the envelope of the modulated waveform.

Figure 2:
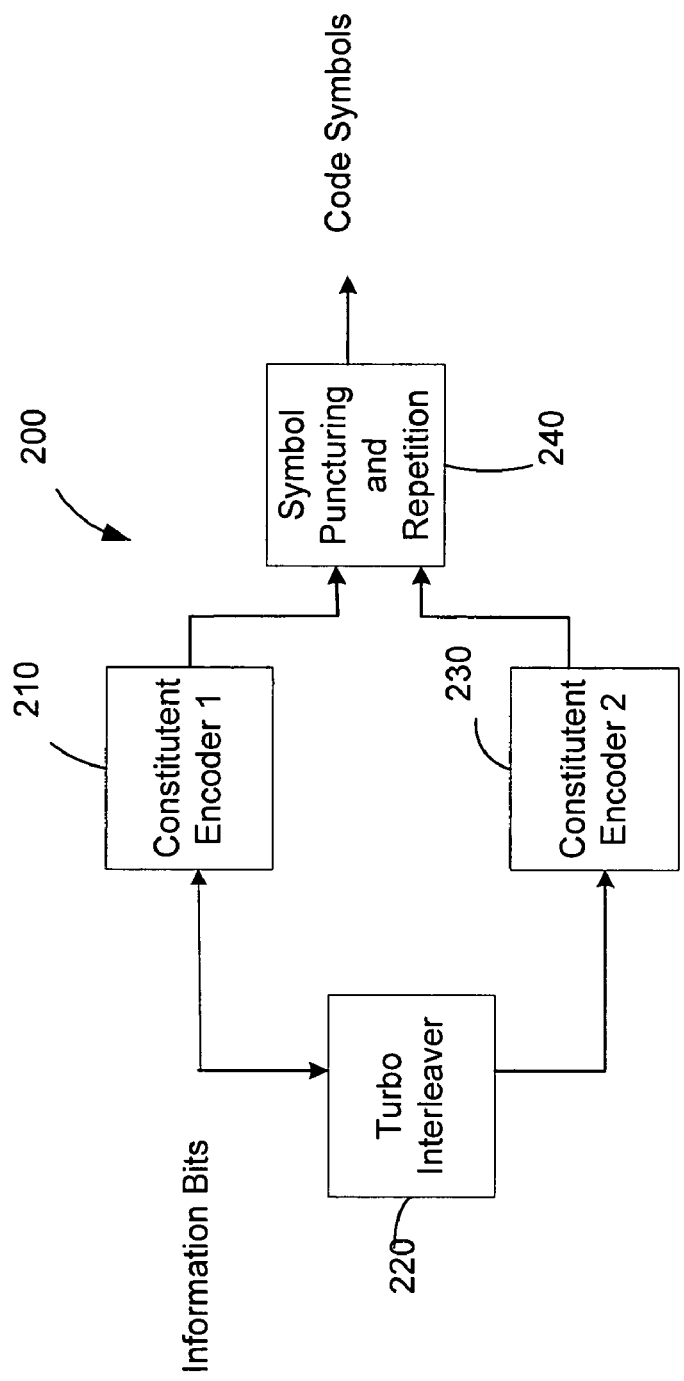
FIG. 2 is a block diagram of a turbo encoder.

Referring to FIG. 2, there is shown a block diagram of a turbo encoder that is configured to operate with the channel interleavers of the invention described herein. Turbo encoder 200 comprises a first constituent encoder 210, a turbo interleaver 220, a second constituent encoder 230, and a symbol generation element 240. The first constituent encoder 210 and the second constituent encoder 230 are connected in parallel, with the turbo interleaver 220 preceding the second constituent encoder 230. The output of the first constituent encoder 210 and the output of the second constituent encoder 230 are input into the symbol generation element 240, wherein the outputs are punctured and repeated in order to form the desired number of turbo encoder output symbols.

In one embodiment, the first and second constituent encoders 210, 230 are recursive, convolutional encoders, each configured in accordance with the transfer function:

$$G(D)=[1, n_0(D)/d(D), n_1(D)/d(D)],$$

wherein $d(D)=1+D^2+D^3$, $n_0(D)=1+D+D^3$, and $n_1(D)=1+D+D^2+D^3$. Using the first and second constituent encoders 210, 230, the turbo encoder 200 generates a plurality of encoded data output symbols and a plurality of encoded tail output symbols, wherein the plurality of encoded data output symbols are subsequently punctured by the symbol generation element 240 and the plurality of encoded tail output symbols are subsequently both punctured and repeated by the symbol generation element 240 as further describes in U.S. application Ser. No. 09/863,196, entitled "Enhanced Channel Interleaving for Optimized Data Throughput," which is assigned to the assignee of the present invention.

Figure 3:
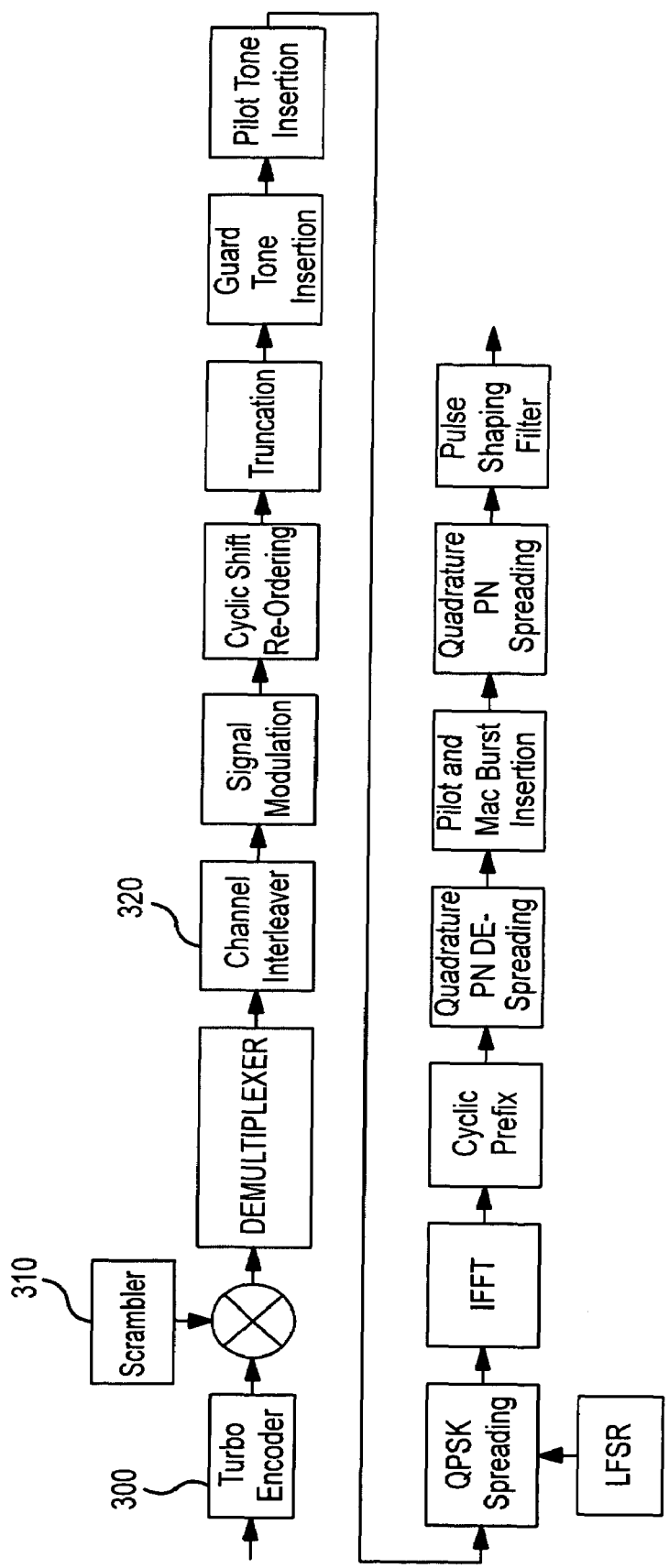
FIG. 3 is a block diagram of an apparatus that uses a turbo encoder to generate forward traffic channels.

FIG. 3 is a block diagram of an apparatus that uses a turbo encoder to generate forward traffic channels. Data packets are input into a turbo encoder 300. Turbo encoder 300 may be configured in the manner described in FIG. 2, but alternative configurations may be implemented without affecting the scope of the embodiments. In one embodiment, a scrambler 310 is used to randomize the output of the turbo encoder 300. Scrambler 310 may be implemented by a linear feedback shift register (LFSR), which is configured in accordance with the generator sequence $h(D)=D^{17}+D^{14}+1$. Every output code symbol of the turbo encoder 300 is XORed with an output bit of the scrambler 310. The scrambler 310 may be initialized by information such as the MAC index value and/or the data rate, and is clocked once for every encoder output symbol. The output of the scrambler 310 is interleaved by a channel interleaver 320. The interleaving is implemented in accordance with the embodiments of the invention as further described below.

Various implementations of channel interleaver 320 may be used to realize the embodiments described below. For example, a channel interleaving element may be produced using at least one memory element and a processor. Alternatively, a look-up table of READ addresses or WRITE addresses may be used to permute an array of input symbols to generate an array of interleaved symbols. In another alternative, a state machine may be used to generate a sequence of addresses defining the permutation of input symbols. Other implementations are known to those of skill in the art, and will not be described herein. The choice of implementation will not affect the scope of the embodiments below.

It is appreciated that the channel interleaver 320 of the invention is capable of operating in HDR systems providing Platinum Broadcast over 1xEV-DO. With Platinum Broadcast, a channel interleaver needs to satisfy the following requirements:

1. Nearly uniform puncturing of parity bits (used to support code rates other than 1/3 and 1/5);
2. Uniform distribution of systematic bits over all OFDM modulation symbols, during the first slot of transmission;
3. Rate-compatibility across data rates within the same rate set. In other words, higher data rate transmissions are truncated versions of the lower data rate transmissions of the same rate set. This is a requirement for any H-ARQ based system. Even though Platinum Broadcast does not employ H-ARQ, this is still a very useful feature for Platinum Broadcast as it enables variable rate broadcast transmission, and it also simplifies modem implementation; and
4. Modulation-friendly sequence repetition: The modulation and sequence repetition steps may be interchanged without affecting the final transmit waveform. This property simplifies the demodulation procedure when sequence repetition is involved.

It should be noted that the current channel interleavers and interleaving techniques satisfy only some of the above requirements. For example, while the data optimized (DO) channel interleaver was designed to satisfy requirement (1) above for code rates in 1xEV-DO, it only partially satisfies requirement (1) for code rates in Platinum Broadcast. In another example, Nokia has proposed a modified channel interleaver for Platinum Broadcast that satisfies requirements (1) and (2) above, but do not meet requirements (3) and (4). See "Enhanced Channel Interleaver Design for DO BCMCS," by Zhou et al. of Nokia.

To further illustrate a first interleaving aspect of the invention, the output of a turbo encoder may be scrambled and demultiplexed into five subsequences denoted as S, $P_0$, $P_0'$, $P_1$, and $P_1'$. In particular, the S sequence refers to the systematic bits of the turbo encoder. The $P_0$ and $P_0'$ sequences refer to the first parity sequences (rate 1/3) from the two constituent encoders of the turbo encoder, and the $P_1$ and $P_1'$ sequences refer to the second parity sequences (rate 1/5) from the two constituent encoders of the turbo encoder. For rate sets 3 and 4, $P_1$ and $P_1'$ denote empty sequences. The rate sets 1-5 in Platinum Broadcast are shown in Table 1. Each of the five sequences S, $P_0$, $P_0'$, $P_1$ and $P_1'$ has a length of N symbols. For rate sets 1 and 4, N=3072; for rate set 2, N=2048; for rate set 3, N=5120; and for rate set 5, N=4096. Let M denote the number of code symbols that can be transmitted in one slot, e.g., M=3840 for rate sets 1, 2 and 3; and for rate sets 4 and 5, M=5120.

Sequence Reorganization

With the above aspect, a block or sequence U is set equal to S, a block or sequence $W_0$ is formed by concatenating $P_0$ and $P_0'$, and a block or sequence $W_1$ is formed by concatenating $P_1$ and $P_1'$. For rate sets 3 and 5, $P_1$ and $P_1'$ and hence block $W_1$ may contain empty sequences. More specifically, with the turbo encoder of the invention operating at rate 1/3, the demultiplexing can be completed using three sequences denoted S, $P_0$, and $P'_0$. In this case, the rearrangement or reorganization of the order of $P_0$ and $P'_0$ results in an equivalent interleaver from the viewpoint of error performance, since the requirement that the first and last sequences remain at the first position and last position has not been violated. Stated another way, the channel interleaver will be configured to permute code symbols in three separate interleaver blocks or sequences with the first block or sequence U comprising the sequence of S symbols, the second block or sequence $W_0$ comprising the sequence of $P_0$ and $P'_0$ symbols, and the third block or sequence $W_1$ comprising the sequence of $P_1$ and $P'_1$ symbols. As mentioned above, in the embodiment wherein the turbo encoder operates at rate=1/3, the channel interleaver will be configured to permute code symbols in two separate blocks or sequences, with the first block or sequence U comprising the sequence of S sequences and the second block or sequence $W_0$ comprising the sequence of $P_0$ and $P'_0$ symbols.

In an embodiment wherein a scrambling element is used upon the output symbols of the turbo encoder before channel interleaving occurs, the above embodiment may still be implemented upon a block or sequence of scrambled S symbols, a block or sequence of scrambled $P_0$ and $P'_0$ symbols, and a block or sequence of the scrambled $P_1$ and $P'_1$ symbols.

Symbol Reordering

Figure 4:
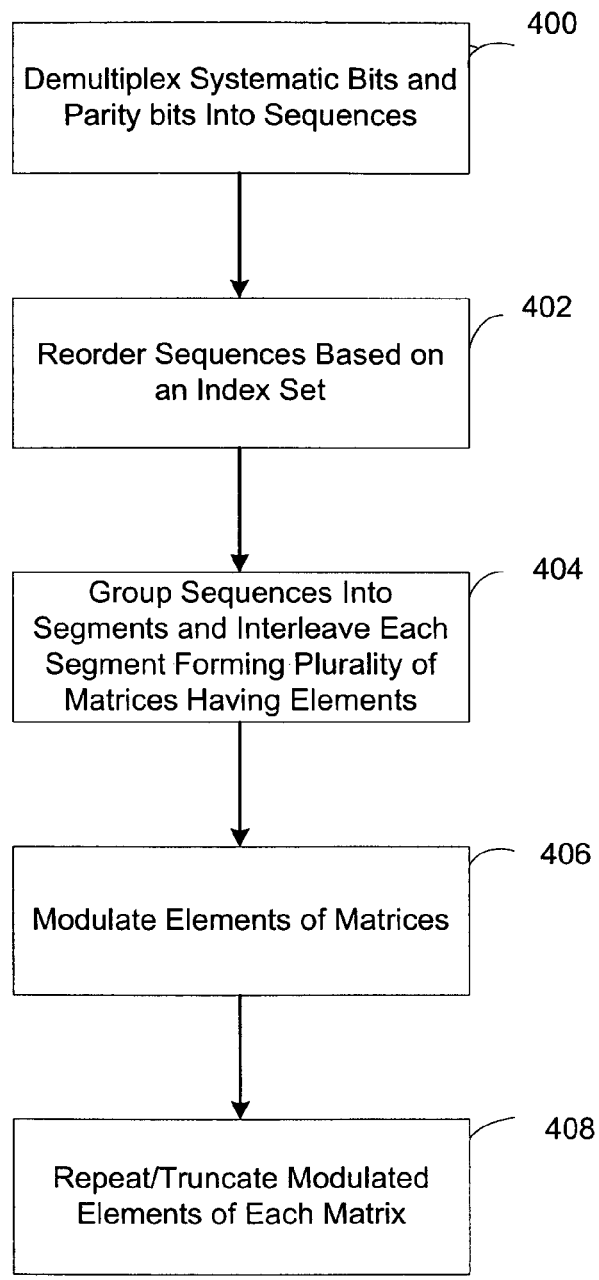
FIG. 4 is a flow chart of an embodiment that reorders the output of a turbo encoder.

FIG. 4 illustrates a flow chart for a series of permutation steps in accordance with the above aspect of the invention. At step 400, sequences S, $P_0$, $P_0'$, $P_1$, and $P_1'$ are written into rectangular arrays of R rows and C columns to form a first input block or sequence U, a second input block or sequence $W_0$ is formed by concatenating $P_0$ and $P_0'$, and a third input block or sequence $W_1$ is formed by concatenating $P_1$ and $P_1'$. The symbols are written into the blocks or sequences by rows, wherein symbols are placed starting from the top row and are placed from left to right. At step 402, the code-symbol sequences are reordered in accordance with the following:

First, define $M_1 = M-N$ if $M>N$, $2M-N$ otherwise $M_2 = \min(2N, M_1+M)$, $M_3 = M_1+M-2N$ if $M_1+M>2N$ $M_2+M-2N$ otherwise As stated above, M is defined as the number of code symbols that can be transmitted in one slot, and N is defined as the length of each of the five sequences S, $P_0$, $P_0'$, $P_1$, and $P_1'$. It is appreciated that other implementations of the interleaver may also be used, for example, a look-up table may be used based on empirical data or other data to determine the values for $M_1$, $M_2$, and $M_3$ to generate the index sets and the code-symbol sequences. That is, $M_1$, $M_2$, and $M_3$ may be arbitrary values specified by a look-up table.

Next, define index sets $S_1$-$S_5$ as follows:

$S_1=\{round(i*(2N/M_1)|0 \leq i<M_1\}$, $S_2=\{round(i*(2N/M_2))|0 \leq i<M_1\}-S_1$, $S_3=\{i|0 \leq i<2N\}-S_1-S_2$, $S_4=\{round(i*(2N/M_3)|0 \leq i<M_3\}$, $S_5=\{i|0 \leq i<2N\}-S_4$.

The elements of each of index sets $S_1$-$S_5$ are then sorted in ascending order.

Next, the code-symbol sequences are reordered as follows:

For rate sets 1, 2 and 4, the code-symbol sequences are reordered as: U, $W_0(S_1)$, $W_0(S_2)$, $W_0(S_3)$, $W_1(S_4)$, $W_1(S_5)$.

For rate sets 3 and 5, the code-symbol sequences are reordered as: U, $W_0(S_1)$, $W_0(S_2)$, $W_0(S_3)$.

Matrix Interleaving

At step 404, the reordered code-symbol sequences from the symbol reordering stage are grouped into several segments of length M each and then each segment is subject to matrix interleaving in accordance with the method described below.

For rate sets 1 and 3, the reordered code-symbol sequences from the symbol reordering stage are grouped into three segments of length M each and then each segment is subject to matrix interleaving with R=4 rows, C=64 columns and L=15 levels.

For rate set 2, the reordered code-symbol sequences from the symbol reordering stage are grouped into two segments of length M each, followed by a third segment of length 5N−2M=2560. Each of the first two segments is subject to matrix interleaving with R=4 rows, C=64 columns and L=15 levels. The third segment is subject to matrix interleaving with R=4 rows, C=128 columns and L=5 levels. For rate set 2, the interleaver output sequence for the turbo encoder will be the interleaved U symbols followed by the interleaved $W_0(S_1)/W_0(S_2)/W_0(S_3)$ symbols.

For rate set 4, the reordered code-symbol sequences from the symbol reordering stage are grouped into three segments of length M each and then each segment is subject to matrix interleaving with R=4 rows, C=256 columns and L=5 levels. For rate set 4, the interleaver output sequence for the turbo encoder will be the interleaved U symbols followed by the interleaved $W_0(S_1)/W_0(S_2)/W_0(S_3)$ symbols and then the interleaved $W_1(S_4)/W_1(S_5)$ symbols.

For rate set 5, the reordered code-symbol sequences from the symbol reordering stage are grouped into two segments of length M each, followed by a third segment of length 3N−2M=2048. Each of the first two segments is subject to matrix interleaving with R=4 rows, C=256 columns and L=5 levels. The third segment is subject to matrix interleaving with R=4 rows, C=512 columns and L=1 level. For rate set 5, the interleaver output sequence for the turbo encoder will be the interleaved U symbols followed by the interleaved $W_0(S_1)/W_0(S_2)/W_0(S_3)$ symbols and then the interleaved $W_1(S_4)/W_1(S_5)$ symbols.

Modulation

Figure 6:
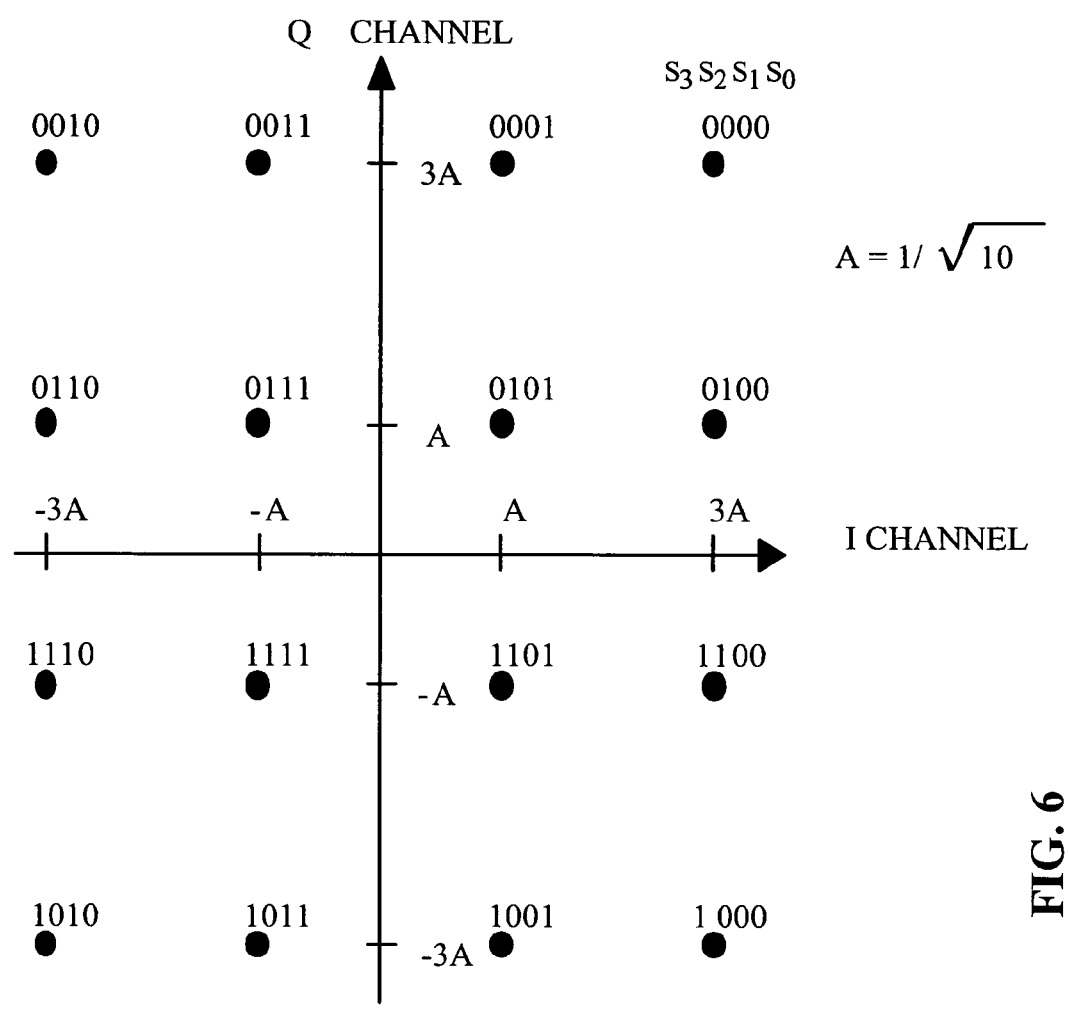
FIG. 6 is a diagram of a signal constellation for the 16-QAM modulation scheme.

At step 406, a 16-ary Quadrature Amplitude Modulation (QAM) is used to modulate the reordered and interleaved symbols from the matrix interleaving stage. FIG. 6 illustrates a signal constellation for the 16-QAM modulation scheme. Four successive channel interleaver output symbols, x(4i), x(4i+1), x(4i+2), and x(4i+3), i=0, . . . , M−1, are mapped to the signal constellation point ($m_I(i)$, $m_Q(i)$). Table 2 specifies the mapping of the interleaved symbols to the modulation symbols.

TABLE 2

| 16-QAM Modulation, where A = 1/√10 | | | | | |
|---|---|---|---|---|---|
| Interleaved Symbols | | | | Modulation Symbols | |
| $s_3$ | $s_2$ | $s_1$ | $s_0$ | | |
| x(4k + 3) | x(4k + 2) | x(4k + 1) | x(4k) | $M_Q(k)$ | $M_I(k)$ |
| 0 | 0 | 0 | 0 | 3A | 3A |
| 0 | 0 | 0 | 1 | 3A | A |
| 0 | 0 | 1 | 1 | 3A | −A |
| 0 | 0 | 1 | 0 | 3A | −3A |
| 0 | 1 | 0 | 0 | A | 3A |
| 0 | 1 | 0 | 1 | A | A |
| 0 | 1 | 1 | 1 | A | −A |
| 0 | 1 | 1 | 0 | A | −3A |
| 1 | 1 | 0 | 0 | −A | 3A |
| 1 | 1 | 0 | 1 | −A | A |
| 1 | 1 | 1 | 1 | −A | −A |
| 1 | 1 | 1 | 0 | −A | −3A |
| 1 | 0 | 0 | 0 | −3A | 3A |
| 1 | 0 | 0 | 1 | −3A | A |
| 1 | 0 | 1 | 1 | −3A | −A |
| 1 | 0 | 1 | 0 | −3A | −3A |

Sequence Repetition/Truncation

Referring back to FIG. 4, at step 408, if the number of required modulation symbols is more than the number provided in the above embodiments, then the complete sequence of input modulation symbols can be repeated as many full-sequence times as possible followed by a partial transmission of a sequence. If a partial transmission is needed, then the first portion of the input modulation symbol sequence may be used. Similarly, if the number of required modulation symbols is less than the number provided, then only the first portion of the input modulation symbol sequence is used and the rest is truncated.

In another aspect of the invention, the modulation step 406 and the sequence repetition/truncation step 408 may be interchanged without affecting the final outcome of the interleaver.

In another aspect of the invention, the output of a turbo encoder may be scrambled and demultiplexed into five sub-sequences denoted as S, $P_0$, $P_0'$, $P_1$, and $P_2'$. Similarly to the first aspect, the S sequence refers to the systematic bits of the turbo encoder. The $P_0$ and $P_0'$ sequences refer to the first parity sequences (rate 1/3) from the two constituent encoders of the turbo encoder, and the $P_1$ and $P_1'$ sequences refer to the second parity sequences (rate 1/5) from the two constituent encoders of the turbo encoder. For rate sets 3 and 4, $P_1$ and $P_1'$ denote empty sequences. Each of the five sequences S, $P_0$, $P_0'$, $P_1$ and $P_1'$ has a length of N symbols. For rate sets 1 and 4, N=3072; for rate set 2, N=2048; for rate set 3, N=5120; and for rate set 5, N=4096. Let M denote the number of code symbols that can be transmitted in one slot, e.g., M=3840 for rate sets 1, 2 and 3; and for rate sets 4 and 5, M=5120.

Matrix Interleaving

Figure 5:
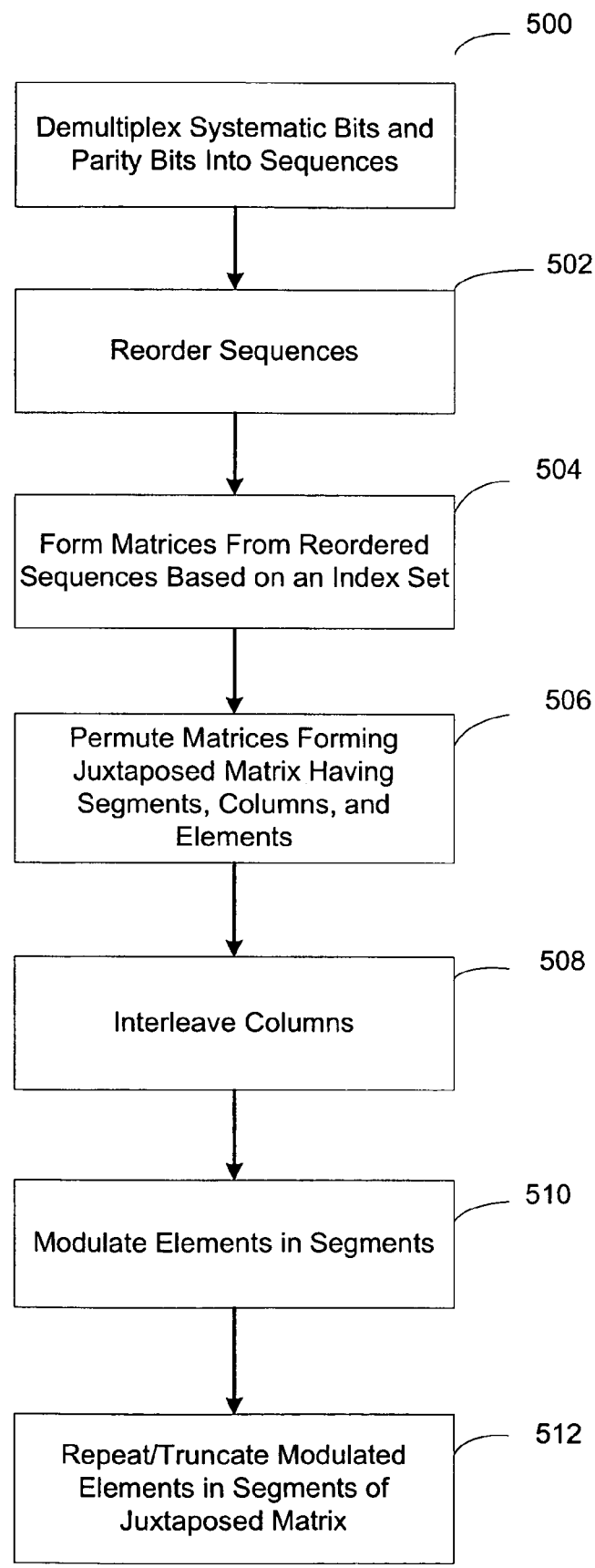
FIG. 5 is a flow chart of another embodiment that reorders the output of a turbo encoder.

FIG. 5 illustrates a flow chart for a series of permutation steps in accordance with this aspect of the invention. The sequences S, $P_0$, $P_0'$, $P_1$, and $P_1'$ are written into rectangular arrays of R rows and C columns to form a first input block or matrix U, a second input block or matrix $W_0$ is formed by concatenating $P_0$ and $P_0'$, and a third input block or matrix $W_1$ is formed by concatenating $P_1$ and $P_1'$. The symbols are written into the blocks or matrices by rows, wherein symbols are placed starting from the top row and are placed from left to right.

More specifically, at step 500, the S sequence is written row-wise into a matrix W with R=4 rows and C=N/R columns. It is appreciated that the number of rows and columns in each matrix is determined by the modulation scheme used for the given packet type. For example, the number of rows is equal to the number of code symbols per modulation symbol (4 for 16-QAM), and the number of columns of each matrix is determined by the length of the sequences U, $P_0$, $P_0'$, etc. The $P_0$ sequence is concatenated with the $P_0'$ sequence, and read into a matrix $W_0$ with R=4 rows and 2C=2N/R columns. If the $P_1$ and $P_1'$ sequences are non-empty, then the $P_1$ sequence is concatenated with the $P_1'$ sequence, and read into a matrix $W_1$ with R=4 rows and 2C=2N/R columns. The symbols are read into each matrix, with column index incrementing first, followed by row index. Next, at step 502, symbols in the i-th column of the W matrix are cyclically shifted by an amount (i mod R). This is referred to as the end-around-shift operation. In the $W_0$ and $W_1$ matrixes, the symbols in the i-th column are end-around shifted by an amount (floor(i/D)mod R), where the parameter D is specified in Table 3. It is appreciated that the values chosen for the above parameters are for exemplary purposes only and that other values may be used.

TABLE 3

Matrix Interleaver Parameters for each Rate-Set

| Rate Set | N | R | C | D |
|---|---|---|---|---|
| 1 | 3072 | 4 | 768 | 4 |
| 2 | 2048 | 4 | 512 | 2 |
| 3 | 5120 | 4 | 1280 | 4 |
| 4 | 4096 | 4 | 1024 | 8 |
| 5 | 3072 | 4 | 768 | 1 |

Column Reordering

At step 504, the columns of matrix $W_0$ are partitioned into sets $S_1$, $S_2$ and $S_3$ as follows:

The index sets $S_1$, $S_2$ and $S_3$ are defined as follows:

$S_1 = \{\text{floor}(C/M_1) + \text{round}(i*(2C/M_1)) | 0 \leq i < M_1\}$, $S_2 = \{\text{floor}(C/M_2) + \text{round}(i*(2C/M_2)) | 0 \leq i < M_2\} - S_1$, $S_3 = \{i | 0 \leq i | 2C\} - S_1 - S_2$, where C is specified in Table 3 and $M_1$, $M_2$ and $M_3$ are specified in Table 4.

If the matrix $W_1$ is non-empty, then the columns of $W_2$ are partitioned into sets $S_4$ and $S_5$ as follows:

$S_4 = \{\text{floor}(C/M_3) + \text{round}(i*(2C/M_3)) | 0 \leq i < M_3\}$, $S_5 = \{i | 0 \leq i | 2C\} - S_4$.

TABLE 4

Column Partitioning Parameters

| Rate Set | $M_1$ | $M_2$ | $M_3$ |
|---|---|---|---|
| 1 | 192 | 1152 | 576 |
| 2 | 448 | 1024 | 384 |
| 3 | 640 | 1600 | N/A |
| 4 | 256 | 1536 | N/A |
| 5 | 512 | 1536 | 1024 |

Within each of index sets $S_1$, $S_2$, ..., $S_5$, the elements are then sorted in increasing order to produce a reordered group of elements.

Matrix Justapostion and Segmentation

At step 506, the matrices W, $W_0$ and $W_1$ are then juxtaposed, with the columns arranged as follows:

W, $W_0(S_1)$, $W_0(S_2)$, $W_0(S_3)$, $W_1(S_4)$, $W_1(S_5)$, W ...

In some cases, the $W_1$ matrix is non-empty. If the $W_1$ matrix is non-empty, then the juxtaposed matrix has R=4 rows, 4C or 6C columns, and K levels.

Next, define $L_1 = 2M/R$ if rate set=3

M/R otherwise $L_2 = L_3 = M/R$

The juxtaposed matrix is then segmented into four parts based on their column index $L_1$, $L_2$, and $L_3$. In particular, the first, second and third segments comprise of $L_1$, $L_2$ and $L_3$ columns, respectively, and the fourth segment comprises of the remaining columns of the juxtaposed matrix.

Column Interleaving

At step 508, the columns of the first three segments from the matrix juxtaposition and segmentation stage are interleaved as follows:

In the k-th segment (k=1, 2, 3, ...) of the juxtaposed matrix, the i-th column is moved to the $\pi(i)$-th column, where $\pi(i) = 79i \bmod L_k$, $0 \leq i < L_k$.

The symbols in each segment are then read out with row index incrementing first, followed by column index.

Modulation

After the column interleaving stage, at step 510, a 16-QAM is used to modulate the interleaved symbols. In particular, the four consecutive rows of symbols (R=4) from the column interleaving stage are grouped to form a 16-QAM modulation symbol. 16-QAM is discussed above with other aspects of the invention.

Sequence Repetition/Truncation

Similar with other aspects of the invention, at step 512, if the number of required modulation symbols is more than the number provided in the above embodiments, then the complete sequence of input modulation symbols can be repeated as many full-sequence times as possible followed by a partial transmission of a sequence. If a partial transmission is needed, then the first portion of the input modulation symbol sequence can be used. If the number of required modulation symbols is less than the number provided, then only the first portion of the input modulation symbol sequence is used and the rest is truncated.

In another aspect of the invention, the modulation step 510 and the sequence repetition/truncation step 512 may be interchanged without affecting the final outcome of the interleaver.

With the channel interleaver of the invention, higher rate codes such as those used for broadcast/multicast services may be generated simply by discarding or truncating the last few outputs of the interleaver. This procedure provides results that approximate optimal or near optimal turbo codes operating at rates such as 4/5, 2/3, 1/2, 1/3, 1/4, and 1/5, with the appropriate puncture patterns, and other rates designed to operate in systems providing Platinum Broadcast over 1 xEV-DO.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. An apparatus for interleaving a plurality of systematic bits and a plurality of parity bits and to generate an output sequence that is transmitted in multi-slot packets from a base station to a remote station in a wireless communication system, comprising:
    a demultiplexer for demultiplexing the plurality of systematic bits and the plurality of parity bits into a plurality of sequences, wherein the plurality of systematic bits and the plurality of parity bits are sequentially distributed among the plurality of sequences, wherein the plurality of parity bits comprises a first set of parity bits with a first code rate and a second set of parity bits with a second code rate different from the first code rate for the same plurality of systematic bits;
    a channel interleaver coupled to the demultiplexer, the channel interleaver for reordering the plurality of sequences based on an index set, for grouping the plurality of sequences into a plurality of segments and for interleaving each of the segments forming a plurality of matrices having a plurality of elements;
    a signal modulation unit coupled to the channel interleaver for modulating the plurality of elements of the plurality of matrices; and
    a truncation unit for truncating the modulated elements of each matrix of the plurality of matrices, wherein the output sequence comprises truncated modulating elements from each matrix of the plurality of matrices.

2. The apparatus of claim 1, wherein the demultiplexing by the demultiplexer occurs by storing the systematic bits and the parity bits into a plurality of rectangular arrays of R rows and C columns forming a first input block U, a second input block $W_0$, and a third input block $W_1$, wherein the first input block U comprises the systematic bits, the second input block $W_0$ is formed by concatenating a first set of the parity bits, and the third input block $W_1$ is formed by concatenating a second set of the parity bits.

3. The apparatus of claim 2, wherein the systematic bits and the parity bits are written into the plurality of arrays of the input blocks U, $W_0$, and $W_1$ by rows, and wherein the bits are placed starting from the top row and are placed from left to right.

4. The apparatus of claim 1, wherein the index set is sorted in an ascending order.

5. The apparatus of claim 1, wherein the reordering by the channel interleaver occurs by:

defining $M_1 = M - N$ if $M > N$ $2M - N$ otherwise $M_2 = \min(2N, M_1 + M)$, $M_3 = M_1 + M - 2N$ if $M_1 + M > 2N$ $M_2 + M - 2N$ otherwise, where M denotes the number of bits that may be transmitted in one slot and N denotes the length of the plurality of sequences;

defining the index set as having a plurality of sets $S_1$, $S_2$, $S_3$, $S_4$ and $S_5$, where:

$S_1 = \{\text{round}(i*(2N/M_1)) | 0 \leq i < M_1\}$, $S_2 = \{\text{round}(i*(2N/M_2)) | 0 \leq i < M_1\} - S_1$, $S_3 = \{i | 0 \leq i < 2N\} - S_1 - S_2$, $S_4 = \{\text{round}(i*(2N/M_3)) | 0 \leq i < M_3\}$, $S_5 = \{i | 0 \leq i < 2N\} - S_4$;

sorting a plurality of elements of each of the sets $S_1$, $S_2$, $S_3$, $S_4$ and $S_5$ in an ascending order; and reordering the plurality of sequences as follows:

U, $W_0(S_1)$, $W_0(S_2)$, $W_0(S_3)$, $W_1(S_4)$, $W_1(S_5)$ for rate sets 1, 2 and 4, and U, $W_0(S_1)$, $Wo(S_2)$, $Wo(S_3)$ for rate sets 3 and 5.

6. The apparatus of claim 5, wherein parameters for $M_1$, $M_2$, and $M_3$ are stored in a look-up table.

7. The apparatus of claim 1, wherein the grouping and the interleaving by the channel interleaver occur by:

grouping the reordered plurality of sequences into segments of length M each; and performing matrix interleaving on each of the segments.

8. The apparatus of claim 1, wherein a modulation scheme for the-signal modulation unit is 16-QAM.

9. The apparatus of claim 1, wherein the truncation unit further repeats the modulating elements.

10. The apparatus of claim 1, wherein parameters for the index set are stored in a look-up table.

11. A method for interleaving a plurality of systematic bits and a plurality of parity bits and for generating an output sequence that is transmitted in multi-slot packets from a base station to a remote station in a wireless communication system, comprising:

demultiplexing the plurality of systematic bits and the plurality of parity bits into a plurality of sequences, wherein the plurality of systematic bits and the plurality of parity bits are sequentially distributed among the plurality of sequences, wherein the plurality of parity bits comprises a first set of parity bits with a first code rate and a second set of parity bits with a second code rate different from the first code rate for the same plurality of systematic bits;

reordering the plurality of sequences based on an index set;

grouping the plurality of sequences into a plurality of segments and interleaving each of the segments forming a plurality of matrices having a plurality of elements;

modulating the plurality of elements of the plurality of matrices; and truncating the modulated elements of each matrix of the plurality of matrix wherein the output sequence comprises truncated modulating elements from each matrix of the plurality of matrices.

12. The method of claim 11, wherein the demultiplexing occurs by storing the systematic bits and the parity bits into a plurality of rectangular arrays of R rows and C columns forming a first input block U, a second input block $W_0$, and a third input block $W_1$, wherein the input block U comprises the systematic bits, the second input block $W_0$ is formed by concatenating a first set of the parity bits, and the third input block $W_1$ is formed by concatenating a second set of the parity bits.

13. The method of claim 12, wherein the systematic bits and the parity bits are written into the plurality of arrays of the input blocks U, $W_0$, and $W_1$ by rows, and wherein the bits are placed starting from the top row and are placed from left to right.

14. The method of claim 11, wherein the index set is sorted in an ascending order.

15. The method of claim 11, wherein the reordering occurs by:

defining $M_1 = M-N$ if $M > N$ $2M-N$ otherwise $M_2 = \min(2N, M_1+M)$, $M_3 = M_1+M-2N$ if $M_1+M > 2N$ $M_2+M-2N$ otherwise, where M denotes the number of bits that may be transmitted in one slot and N denotes the length of the plurality of sequences;

defining the index set as having a plurality of sets $S_1$, $S_2$, $S_3$, $S_4$ and $S_5$, where:

$S_1 = \{\text{round}(i*(2N/M_1)) | 0 \leq i < M_1\}$, $S_2 = \{\text{round}(i*(2N/M_2)) | 0 \leq i < M_1\} - S_1$, $S_3 = \{i | 0 \leq i < 2N\} - S_1 - S_2$, $S_4 = \{\text{round}(i*(2N/M_3)) | 0 \leq i < M_3\}$, $S_5 = \{i | 0 \leq i < 2N\} - S_4$;

sorting a plurality of elements of each of the sets $S_1$, $S_2$, $S_3$, $S_4$ and $S_5$ in an ascending order; and reordering the plurality of sequences as follows:

U, $W_0(S_1)$, $Wo(S_2)$, $Wo(S_3)$, $W_1(S_4)$, $W_1(S_5)$ for rate sets 1, 2 and 4, and U, $W_0(S_1)$, $Wo(S_2)$, $Wo(S_3)$ for rate sets 3 and 5.

16. The method of claim 15, wherein parameters for $M_1$, $M_2$, and $M_3$ are stored in a look-up table.

17. The method of claim 11, wherein the grouping and the interleaving occurs by:

grouping the reordered plurality of sequences into segments of length M each; and performing matrix interleaving on each of the segments.

18. The method of claim 11, wherein the modulation scheme for the modulating step is 16-QAM 19. The method of claim 11, wherein the truncating further comprises repeating the modulating elements.

20. The method of claim 11, wherein parameters for the index set are stored in a look-up table.

21. The method of claim 11, wherein the truncating is performed in accordance with a desired code symbol rate.

22. A method for interleaving a plurality of systematic bits and a plurality of parity bits and for generating an output sequence that is transmitted in multi-slot packets from a base station to a remote station in a wireless communication system, comprising:

demultiplexing the plurality of systematic bits and the plurality of parity bits into a plurality of sequences, wherein the plurality of systematic bits and the plurality of parity bits are sequentially distributed among the plurality of sequences, wherein the plurality of parity bits comprises a first set of parity bits with a first code rate and a second set of parity bits with a second code rate different from the first code rate for the same plurality of systematic bits;

reordering the plurality of sequences based on an index set;

grouping the plurality of sequences into a plurality of segments and interleaving each of the segments forming a plurality of matrices having a plurality of elements;

truncating the elements of each matrix of the plurality of matrices, wherein the output sequence comprises truncated elements from each matrix of the plurality of matrices; and modulating the elements of the plurality of matrices.

23. The method of claim 22, wherein the index set is sorted in an ascending order.

24. An apparatus for interleaving a plurality of systematic bits and a plurality of parity bits and to generate an output sequence that is transmitted in multi-slot packets from a base station to a remote station in a wireless communication system, comprising:
- a demultiplexer for demultiplexing the plurality of systematic bits and the plurality of parity bits into a plurality of sequences, wherein the plurality of systematic bits and the plurality of parity bits are sequentially distributed among the plurality of sequences, wherein the plurality of parity bits comprises a first set of parity bits with a first code rate and a second set of parity bits with a second code rate different from the first code rate for the same plurality of systematic bits;
- a channel interleaver coupled to the demultiplexer, the channel interleaver;
    a) for reordering the plurality of sequences;
    b) for forming a plurality of matrices from the reordered plurality of sequences, wherein the forming means is based on an index set;
    c) for permuting the plurality of matrices forming a juxtaposed matrix having a plurality of segments, a plurality of columns, and a plurality of elements; and
    d) for interleaving the plurality of columns;
- a signal modulation unit coupled to the channel interleaver for modulating the plurality of elements in the plurality of segments; and
- a truncation unit for truncating the modulated elements in the plurality of segments of the juxtaposed matrix, wherein the output sequence comprises truncated modulating elements from the plurality of segments of the juxtaposed matrix.

25. The apparatus of claim 24, wherein the demultiplexing by the demultiplexer occurs by storing the systematic bits and the parity bits into a plurality of rectangular arrays of R rows and C columns forming a first input block U, a second input block $W_0$, and a third input block $W_1$, wherein the first input block U comprises the systematic bits, the second input block $W_0$ is formed by concatenating a first set of the parity bits, and the third input block $W_1$ is formed by concatenating a second set of the parity bits.

26. The apparatus of claim 24, wherein the systematic bits and the parity bits are written into the plurality of arrays of the input blocks U, $W_0$, and $W_1$ by rows, and wherein the bits are placed starting from the top row and are placed from left to right.

27. The apparatus of claim 24, wherein the index set is sorted in an ascending order.

28. The apparatus of claim 25, wherein the reordering by the channel interleaver occurs by:
- end-around shifting downward each element in each column of each block; and
- switching the order of the columns within each block.

29. The apparatus of claim 28, wherein within the first input block U, the elements in the i-th column are cyclically shifted by an amount (i mod R), where R denotes the number of rows of the rectangular arrays forming the input blocks.

30. The apparatus of claim 28, wherein within the input blocks $W_o$ and $W_1$, the elements in the i-th column are cyclically shifted by an amount (floor(i/D)mod R), where D is a predetermined parameter based on a rate set and R denotes the number of rows of the rectangular arrays forming the input blocks.

31. The apparatus of claim 24, wherein the forming by the channel interleaver occurs by:
defining the index set as having a plurality of sets $S_1, S_2, S_3, S_4$ and $S_5$, where:

$S_1 = \{\text{floor}(C/M_1) + \text{round}(i*(2C/M_1)) | 0 \leq i < M_1\}$, $S_2 = \{\text{floor}(C/M_2) + \text{round}(i*(2C/M_2)) | 0 \leq i < M_2\} - S_1$, $S_3 = \{i | 0 \leq i | 2C\} - S_1 - S_2$, $S_4 = \{\text{floor}(C/M_3) + \text{round}(i*(2C/M_3)) | 0 \leq i < M_3\}$, and, $S_5 = \{i | 0 \leq i | 2C\} - S_4$.

wherein parameters $M_1$, $M_2$ and $M_3$ are specified in a look-up table and C denotes the number of columns of the rectangular arrays forming the input blocks.

32. The apparatus of claim 24, wherein the permuting occurs by the channel interleaver occurs by:
arranging the columns of the plurality of matrices as W, $W_0(S_1)$, $W_0(S_2)$, $W_0(S_3)$, $W_1(S_4)$, $W_1(S_5)$, and
dividing the juxtaposed matrix into a plurality of segments including $L_1, L_2, L_3$ and $L_4$ columns, where $L_1, L_2, L_3$ and $L_4$ are defined as:

$L_1 = 2M/R$ if rate set=3

M/R otherwise $L_2 = L_3 = M/R$ $L_4$ = remaining columns, where M denotes the number of code symbols that may be transmitted in one slot, and R denotes the number of rows of the rectangular arrays forming the input blocks.

33. The apparatus of claim 32, wherein parameters for $M_1$, $M_2$, and $M_3$ are stored in a look-up table.

34. The apparatus of claim 32, wherein the juxtaposed matrix has 4 rows, 4C or 6C columns, and K levels, where C denotes the number of columns of the rectangular arrays forming the input blocks and K denotes the level of interleaving for the juxtaposed matrix.

35. The apparatus of claim 32, wherein the interleaving by the channel interleaver occurs by:
shifting the i-th column to the π(i)-th column in each of the k-th segments (k=1, 2, 3), where $\pi(i) = 79i \bmod L_k$, $0 \leq i < L_k$; and reading the elements in each of the segments with row index incrementing first, followed by column index.

36. The apparatus of claim 24, wherein a modulation scheme for the signal modulation unit is 16-QAM.

37. The apparatus of claim 24, wherein the truncation unit further repeats the modulating elements.

38. The apparatus of claim 24, wherein parameters for the index set are stored in a look-up table.

39. A method for interleaving a plurality of systematic bits and a plurality of parity bits and to generate an output sequence that is transmitted in multi-slot packets from a base station to a remote station in a wireless communication system, comprising:
demultiplexing the plurality of systematic bits and the plurality of parity bits into a plurality of sequences, wherein the plurality of systematic bits and the plurality of parity bits are sequentially distributed among the plurality of sequences, wherein the plurality of parity bits comprises a first set of parity bits with a first code rate and a second set of parity bits with a second code rate different from the first code rate for the same plurality of systematic bits;
reordering the plurality of sequences;
forming a plurality of matrices from the reordered plurality of sequences, wherein the forming is done is based on an index set;
permuting the plurality of matrices forming a juxtaposed matrix having a plurality of segments, a plurality of columns, and a plurality of elements;
interleaving the plurality of columns;
modulating the plurality of elements in the plurality of segments; and
truncating the modulated elements in the plurality of segments of the juxtaposed matrix, wherein the output sequence comprises truncated modulating elements from the plurality of segments of the juxtaposed matrix.

40. The method of claim 39, wherein the demultiplexing occurs by storing the systematic bits and the parity bits into a plurality of rectangular arrays of R rows and C columns forming a first input block U, a second input block $W_0$, and a third input block $W_1$, wherein the first input block U comprises the systematic bits, the second input block Wo is formed by concatenating a first set of the parity bits, and the third input block $W_1$ is formed by concatenating a second set of the parity bits.

41. The method of claim 39, wherein the systematic bits and the parity bits are written into the plurality of arrays of the input blocks U, $W_0$, and $W_1$ by rows, and wherein the bits are placed starting from the top row and are placed from left to right.

42. The method of claim 39, wherein the index set is sorted in an ascending order.

43. The method of claim 40, wherein the reordering occurs by:
end-around shifting downward each element in each column of each block; and
switching the order of the columns within each block.

44. The method of claim 43, wherein within the first input block U, the elements in the i-th column are cyclically shifted by an amount (i mod R), where R denotes the number of rows of the rectangular arrays forming the input blocks.

45. The method of claim 43, wherein within the input blocks $W_0$ and $W_1$, the elements in the i-th column are cyclically shifted by an amount (floor(i/D)mod R), where D is a predetermined parameter based on a given rate set and R denotes the number of rows of the rectangular arrays forming the input blocks.

46. The method of claim 39, wherein the forming occurs by:
defining the index set as having a plurality of sets $S_1, S_2, S_3, S_4$ and $S_5$, where:

$S_1=\{\text{floor}(C/M_1)+\text{round}(i*(2C/M_1))|0\leq i<M_1\}$, $S_2=\{\text{floor}(C/M_2)+\text{round}(i*(2C/M_2))|0\leq i<M_2\}-S_1$, $S_3=\{i|0\leq i|2C\}-S_1-S_2$, $S_4=\{\text{floor}(C/M_3)+\text{round}(i*(2C/M_3))|0\leq i<M_3\}$, and, $S_5=\{i|0\leq i|2C\}-S_4$.

wherein parameters $M_1$, $M_2$ and $M_3$ are specified in a look-up table and C denotes the number of columns of the rectangular arrays forming the input blocks.

47. The method of claim 39, wherein the permuting occurs by:
arranging the columns of the plurality of matrices as W, $W_0(S_1)$, $W_0(S_2)$, $W_0(S_3)$, $W_1(S_4)$, $W_1(S_5)$, and
dividing the juxtaposed matrix into a plurality of segments including $L_1$, $L_2$, $L_3$ and $L_4$ columns, where $L_1$, $L_2$, $L_3$ and $L_4$ are defined as:

$L_1=2M/R$ if rate set=3

$M/R$ otherwise $L_2=L_3=M/R$ $L_4$=remaining columns, where M denotes the number of code symbols that may be transmitted in one slot, and R denotes the number of rows of the rectangular arrays forming the input blocks.

48. The method of claim 47, wherein parameters for $L_1$, $L_2$, and $L_3$ are stored in a look-up table.

49. The method of claim 47, wherein the juxtaposed matrix has 4 rows, 4C or 6C columns, and K levels, where C denotes the number of columns of the rectangular arrays forming the input blocks and K denotes the level of interleaving for the juxtaposed matrix.

50. The method of claim 47, wherein the interleaving occurs by:
shifting the i-th column to the $\pi(i)$-th column in each of the k-th segments (k=1, 2, 3), where $\pi(i)=79i \bmod L_k$, $0\leq i<L_k$; and reading the elements in each of the segments with row index incrementing first, followed by column index.

51. The method of claim 39, wherein the modulation scheme for the modulating is 16-QAM.

52. The method of claim 39, wherein the truncating further comprises repeating the modulating elements.

53. The method of claim 39, wherein parameters for the index set are stored in a look-up table.

54. The apparatus of claim 1, wherein at least one of the demultiplexer, channel interleaver, signal modulation unit and truncation unit comprises a memory element and a control element coupled to the memory element, wherein the control element is configured to perform the functions of at least one of the above said units, and wherein the control element includes at least one of a general purpose processor, a digital signal processor (DSP), an application specific integrated circuit (ASIC), a field programmable gate array (FPGA), a discrete gate or transistor logic, a microprocessor, a controller, and a state machine.

55. The apparatus of claim 24, wherein at least one of the demultiplexer, channel interleaver, signal modulation unit and truncation unit comprises a memory element and a control element coupled to the memory element, wherein the control element is configured to perform the functions of at least one of the above said units, and wherein the control element includes at least one of a general purpose processor, a digital signal processor (DSP), an application specific integrated circuit (ASIC), a field programmable gate array (FPGA), a discrete gate or transistor logic, a microprocessor, a controller, and a state machine.

* * * * *

UNITED STATES PATENT AND TRADEMARK OFFICE
CERTIFICATE OF CORRECTION

| | | |
|---|---|---|
| PATENT NO. | : 7,685,495 B2 | Page 1 of 1 |
| APPLICATION NO. | : 11/305579 | |
| DATED | : March 23, 2010 | |
| INVENTOR(S) | : Bhushan et al. | |

It is certified that error appears in the above-identified patent and that said Letters Patent is hereby corrected as shown below:

Column 18, line 44, claim 2: "a first set" to read as --the first set--

Column 18, line 45, claim 2: "a second set" to read as --the second set--

Column 19, line 52, claim 11: "plurality of matrix" to read as --plurality of matrices,--

Column 19, line 61, claim 12: "a first set" to read as --the first set--

Column 19, line 62, claim 12: "a second set" to read as --the second set--

Column 20, line 41, claim 18: "the modulation scheme" to read as --a modulation scheme--

Column 21, line 26, claim 24: "the forming means" to read as --a forming means--

Column 21, line 46, claim 25: "a first set" to read as --the first set--

Column 21, line 47, claim 25: "a second set" to read as --the second set--

Column 23, line 25, claim 40: "a first set" to read as --the first set--

Column 23, line 26, claim 40: "a second set" to read as --the second set--

Column 24, line 24, claim 49: "the juxtaposed matrix" to read as --a juxtaposed matrix--

Column 24, line 25, claim 49: "juxtaposed matnx" to read as --juxtaposed matrix--

Column 24, line 35, claim 51: "the modulation scheme" to read as --a modulation scheme--

Column 24, line 36, claim 51: "modulating is" to read as --signal modulation unit is--

Signed and Sealed this
Fifth Day of July, 2011

David J. Kappos
*Director of the United States Patent and Trademark Office*